(12) United States Patent
Albrich et al.

(10) Patent No.: US 6,356,202 B1
(45) Date of Patent: Mar. 12, 2002

(54) CIRCUIT FOR MONITORING TROUBLE-FREE STATE AND/OR DETECTING INCORRECT STATE OF AN INSTALLATION

(75) Inventors: Reinhard Albrich, Dornbirn (AT); Karl Herrmann, Haslach (DE); Jean-Luc Lamarche, Mittelhausbergen (FR); Manfred Strobel, Weingarten (DE)

(73) Assignees: i f m electronic GmbH, Essen (DE); Doppelmayr Seilbahn-Produktionsgesellschaft m.b.H, Wolfurt (AT)

( * ) Notice: Subject to any disclaimer, the term of this patent is extended or adjusted under 35 U.S.C. 154(b) by 0 days.

(21) Appl. No.: 09/341,691
(22) PCT Filed: Nov. 21, 1998
(86) PCT No.: PCT/EP98/07488
§ 371 Date: Jul. 26, 1999
§ 102(e) Date: Jul. 26, 1999
(87) PCT Pub. No.: WO99/27649
PCT Pub. Date: Jun. 3, 1999

(30) Foreign Application Priority Data

Nov. 26, 1997 (DE) .......................... 197 52 362

(51) Int. Cl.⁷ .............................................. G08B 21/00
(52) U.S. Cl. .................... 340/686.2; 340/505; 340/507; 340/679; 340/686.1; 340/687
(58) Field of Search .................................. 340/505, 506, 340/507, 541, 686.1, 679, 687, 686.2, 517, 518, 686.6; 700/292; 200/61.18, 43.05; 104/179, 307; 187/278; 212/276

(56) References Cited

U.S. PATENT DOCUMENTS

| | | | | | |
|---|---|---|---|---|---|
| 4,003,314 | A | * | 1/1977 | Pearson | 104/307 |
| 4,019,002 | A | * | 4/1977 | Kunczynski | 200/61.18 |
| 4,042,797 | A | * | 8/1977 | De Araujo et al. | 200/43.05 |
| 4,151,459 | A | * | 4/1979 | Fayolle et al. | 324/533 |
| 4,271,763 | A | | 6/1981 | Berger | 200/61.18 |
| 4,290,055 | A | * | 9/1981 | Furney et al. | 340/518 |
| 4,358,020 | A | * | 11/1982 | Thiele | 212/276 |
| 4,363,945 | A | * | 12/1982 | Kunczynski | 200/61.18 |
| 4,375,637 | A | * | 3/1983 | Desjardins | 340/517 |
| 4,459,582 | A | * | 7/1984 | Sheahan et al. | 340/539 |
| 4,643,276 | A | * | 2/1987 | Philobos | 187/278 |
| 4,671,187 | A | * | 6/1987 | Kunczynski | 104/179 |
| 4,864,519 | A | * | 9/1989 | Appleby et al. | 700/292 |
| 4,994,788 | A | * | 2/1991 | Philippe et al. | 340/505 |
| 5,581,180 | A | | 12/1996 | Ito et al. | 324/207.11 |

FOREIGN PATENT DOCUMENTS

| | | |
|---|---|---|
| DE | 32 19 270 | 11/1983 |
| EP | 0 809 361 | 11/1997 |

* cited by examiner

Primary Examiner—Brent A. Swarthout
(74) Attorney, Agent, or Firm—Nixon Peabody LLP; David S. Safran

(57) ABSTRACT

A circuit is described for monitoring the faultless state and/or for detecting the faulty state of a cable railway or chairlift system, with a plurality of monitoring and detection devices (1) and with at least one control and evaluation unit (2), the monitoring and detection devices (1) being series-connected to one another and to the control and evaluation unit (2) and having the potential to be interrogated with respect to their state, especially with respect to their operating state. To be able to meet safety requirements which are as high as possible and at the same time to require only a small installation space, each monitoring and detection device (1) has several different influence areas (3) and several signal outputs.

15 Claims, 2 Drawing Sheets

CIRCUIT FOR MONITORING TROUBLE-FREE STATE AND/OR DETECTING INCORRECT STATE OF AN INSTALLATION

BACKGROUND OF THE INVENTION

The invention relates to a circuit for monitoring the faultless state and/or for detecting the faulty state of a system, for example of a cable railway or chairlift system, with a plurality of monitoring and detection devices and with at least one control and evaluation unit, the monitoring and detection devices being series-connected to one another and to the control and evaluation unit and having the potential to be interrogated with respect to their state, especially with respect to their operating state.

Systems of the most varied type, especially so-called safety-relevant systems, often require continuous monitoring, i.e. monitoring of the faultless state, and generally in conjunction with the monitoring of the faultless state, the detection of a faulty state. As soon as a faulty state has been recognized, a safety-relevant measure is initiated.

In cable railway or chairlift systems the location of the cable relative to the cable pulleys which carry or guide the cable must be monitored as the safety-relevant criterion. If the actual position of the cable does not correspond to the nominal position relative to at least one cable pulley, safety-relevant measures must be taken. For a small deviation between the actual location of the cable and its nominal location, the safety-relevant measure derived therefrom can be a reduction of the cable speed. If the deviation between the actual position of the cable and the nominal position exceeds a stipulated boundary value, the safety-relevant measure in any case consists in that the cable railway system or chairlift system is instantly shut down.

In electrical and now of course also electronic circuits which operate as control circuits, it is distinguished between the working current principle and the bias current principle. In the working current principle, control interventions are initiated for example into the system when a large enough control current is flowing in the control circuit. In the control circuit which operates according to the working current principle the existing switching devices are built as make contacts; they are electrically conductive when they are actuated. In contrast, in the bias current principle control interventions are initiated for example into the system when no control current is flowing in the control circuit. In the control circuits which operate according to the bias current principle the existing switching devices are made as break contacts; they are electrically nonconductive when they are actuated.

In the control circuit built according to the working current principle, as detailed above, control interventions are initiated into an assigned system only when a large enough control current is flowing in the control circuit. The prerequisite therefore is that on the one hand the necessary operating voltage is present, that on the other hand there are no breaks in the line, and that ultimately the switching device which is made as a make contact and which is present in this control circuit is serviceable. In contrast, in the control circuit which operates according to the bias current principle control interventions are initiated into the system which belongs thereto when no control current is flowing in the control circuit.

The aforementioned statements on the working current principle and the bias current principle illustrate that control circuits which are designed to trigger safety-relevant measures must work according to the bias current principle. Since the currentless state in the control circuit is evaluated such that the corresponding system is in a safe state, failure of the operating voltage and a break in the line always lead to the system being moved into the safe state if it is not in the safe state. In a cable railway or chairlift system the safe state is of course the cable drive turned off.

In the control circuits which work according to the working current principle, therefore in control circuits in which the switching devices are made as make contacts, the switching devices are connected in parallel; after actuating a switching device built as a make contact the control circuit takes effect overall. Conversely, in the control circuits operating according to the bias current principle, therefore in control circuits in which the switching devices are made as break contacts, the switching devices are connected in series; after actuating a switching device made as a break contact the control circuit becomes currentless and thus operative overall.

So that in a circuit of the type under consideration, when a faulty state of the system has been detected by the series connection of all monitoring and detection devices, the fault can be located, it is provided that the monitoring and detection devices can be interrogated with respect to their state, especially with respect to their operating state.

How the monitoring and detection devices are made individually in a circuit of the described type depends mainly on how the system is built in particular, in which using this circuit the faultless state is to be monitored and the faulty state is to be detected. If the system is a cable railway or chairlift system, it is provided according to the not yet published patent application Ser. No. 196 20 065.2 that each monitoring and detection device has three proximity indicators and the latter are logically interconnected directly or indirectly. Here the problem is the increased amount of space required due to the three sensors, space which is often not available.

SUMMARY OF THE INVENTION

The object of this invention is to configure a circuit of the described type such that the monitoring meets especially high safety requirements and can also be used even when the installation space is small.

The aforementioned object is achieved first of all and essentially by each monitoring and detection device having several different influence areas and several signal outputs. Here, within the framework of the invention the influence area is defined as that three-dimensional area at a distance to the monitoring and detection device within which the presence or absence of a monitored article leads to a change of state in the monitoring and detection device. In a conventional proximity switch the influence area is the area over the active surface of the proximity switch in which the latter reacts to the approach of the vaporizing material, i.e. a conventional proximity switch has exactly one influence area.

Because as claimed in the invention each monitoring and detection device has several different influence areas, accurate and selective monitoring of the state of the system is possible. Thus it is possible to distinguish not only between a faulty and a faultless state, but in addition the deterioration of the faultless state can be recognized and thus by initiating the corresponding measures the occurrence of a faulty state can possibly be avoided. When the location of the cable of a cable railway or chairlift system is being monitored relative to the cable pulleys which guide the cable, the lateral slippage of the cable can be detected.

In one preferred embodiment of the invention the monitoring and detection devices have one control input and one control output, the control output of monitoring and detection device (n−1) being connected to the control input of the monitoring and detection device n. Thus, on the one hand the series connection of the monitoring and detection devices which is necessary for safety reasons is implemented, on the other hand the voltage drops on the monitoring and detection devices are prevented from adding up. The control input of the first monitoring and detection device is connected to the control and evaluation unit and a clocked signal which is preferably cyclically reprogrammed is supplied to it by the control and evaluation unit.

According to another teaching of the invention, in the circuit as claimed in the invention the monitoring and detection devices can be interrogated not only with respect to their state, especially with respect to their operating state, but can also be addressed. This means that each individual monitoring and detection device is individualized by a certain address being assigned to it. For the interrogation of the state of a certain monitoring and detection device therefore the monitoring and detection device which has been individualized by its address is "operated" and then its state, in a version as a switching device its operating state, is interrogated. Here the monitoring and detection devices and the control and evaluation unit form a ring with respect to the interrogation and addressing possibility via the corresponding connecting lines.

Advantageously the addresses and information are transmitted via the connecting lines only in one direction, i.e. opposite the transmission direction of the clocked signal supplied by the control and evaluation unit to the control input of the first monitoring and detection device. Thus, failure of one monitoring and detection device or breakage of a transmission cable can be detected.

According to one preferred embodiment of the invention, one of the influence areas can be divided into two component areas, the subdivision into the two component areas taking place perpendicularly to the division into influence areas. In this way, in addition to the lateral slippage of a cable of a cable railway or chairlift system relative to the cable pulleys which guide the cable, a change of the cable location perpendicular thereto can also be acquired. This change of the cable location can occur for example when the cable pulleys change their position by their loading or when wear of the running surfaces of the cable pulleys occurs.

BRIEF DESCRIPTION OF THE DRAWINGS

In particular, there are now different possibilities for embodying and developing the circuit as claimed in the invention. These embodiments and developments follow from the patent claims subordinate to claim 1 and from the following description of one embodiment in conjunction with the drawings. In the drawings FIG. 1 schematically shows an extract from a cable railway or chairlift system in which the circuit as claimed in the invention is used, FIG. 2 schematically shows one preferred embodiment of a circuit as claimed in the invention.

DESCRIPTION OF THE PREFERRED EMBODIMENT

Figure 1:
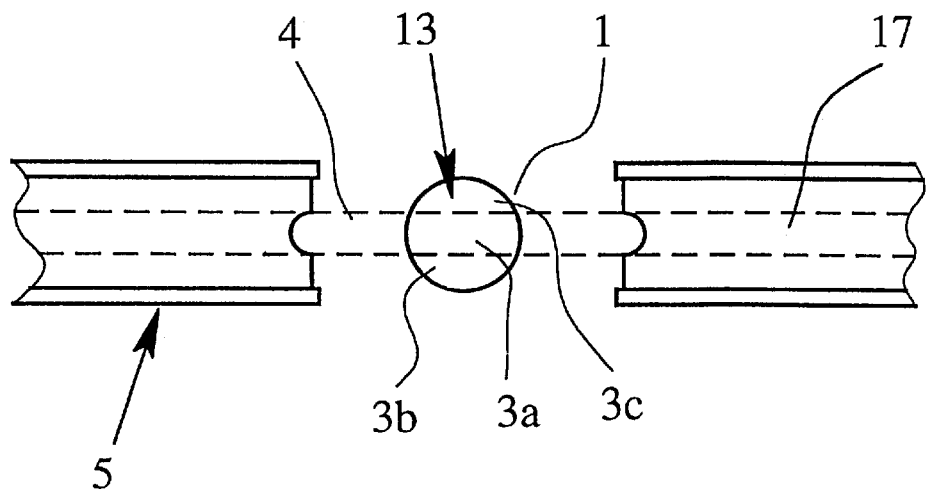
Figure 2:
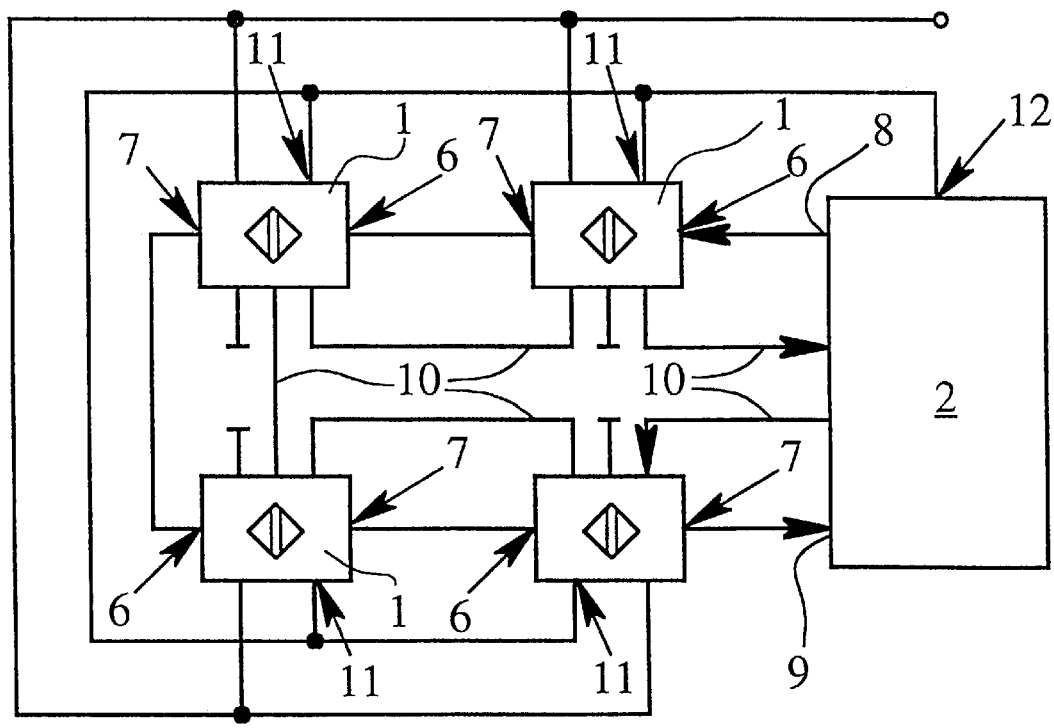

The circuit shown in FIG. 2 is designed to monitor the faultless state and to detect a faulty state of a system, for example the cable or chairlift system which is shown only in extracts and schematically in FIG. 1, and in its basic structure consists of a plurality of monitoring and detection devices 1 and of a control and evaluation unit 2. The monitoring and detection devices 1 are series connected to one another and to the control and evaluation unit 2.

FIG. 1 shows that each monitoring and detection device 1 has three different influence areas 3a, 3b, 3c, the three influence areas 3a, 3b, 3c being operational first of all perpendicularly to the lengthwise direction of the cable 4 next to one another. The following situations can arise:

1. The actual position of the cable 4, as shown in FIG. 1, corresponds to the nominal position. Then the cable 4 is in the influence area 3a, and the signal output which corresponds to the influence area 3a is therefore switched through.
2. The actual position of the cable 4 no longer corresponds to the nominal position.
2.a) The cable 4 is to the left of the nominal position shown in FIG. 1 and is thus in the influence area 3b. The signal output which corresponds to the influence area 3b is therefore switched through.
2.b) The cable 4 is to the right of the nominal position shown in FIG. 1 and is thus in the influence area 3c. The signal output which corresponds to the influence area 3c is therefore switched through.
2.c) The cable 4 is to the right or left outside of the cable pulleys 5 and is thus outside of the influence areas 3a, 3b, and 3c.

With these assumptions the following applies:

If the signal output which corresponds to the influence area 3a is switched through, but the other two signal outputs are not, this means that the cable is in its actual position. The cable railway or chairlift system can be operated at normal speed.

If the signal output which corresponds to the influence area 3a and additionally the signal output which corresponds to the influence area 3b or 3c are switched through, this is the criterion for the actual position of the cable 4 no longer agreeing exactly with the nominal position. Here it can be enough if the cable railway or chairlift system is operated with a slightly reduced speed.

If only the signal output which corresponds to the influence area 3b or 3c is switched through, this is the criterion for the actual position of the cable 4 deviating greatly from the nominal position.

If all three signal outputs are switched through, this is an undefined state. In this case the circuit must intervene immediately.

If none of the three signal outputs is switched through, this is a safety-relevant criterion and the circuit must immediately intervene. In a cable railway or chairlift system this would mean that the cable 4 has jumped out of the cable pulley 5 and the cable railway or chairlift system must be shut down immediately.

FIG. 2 shows only four monitoring and detection devices 1. But generally the circuit as claimed in the invention includes a host of monitoring and detection devices 1, in a circuit for monitoring the faultless state and for detecting a faulty state of a cable railway or chairlift system, fifty or more monitoring and detection devices 1 can easily be necessary, distributed over several hundred meters.

The monitoring and detection devices 1 each have one control input 6 and one control output 7, the control output 7 of the first monitoring and detection device 1 being connected to the control input 6 of the second monitoring and detection device 1, the control output 7 of the second monitoring and detection device 1 being connected to the control input 6 of the third monitoring and detection device 1, and the control output 7 of the third monitoring and detection device 1 being connected to the control input 6 of the fourth monitoring and detection device 1. The control input 6 of the first monitoring and detection device 1 is connected to the control output 8 of the control and evaluation unit 2 and a clocked signal which is preferably cyclically reprogrammed is supplied to it by the control and evaluation unit. The control output 7 of the fourth monitoring and detection device 1 is connected to the control input 9 of the control and evaluation unit 2. This serial connection of the individual monitoring and detection devices 1 forms the signal line of the circuit via which the individual monitoring and detection devices 1 send the safety-relevant signals to the control and evaluation unit 2.

For the embodiment of a circuit as claimed in the invention which is shown in FIG. 2, it furthermore applies that the monitoring and detection devices 1 and the control and evaluation unit 2 form a ring with respect to the interrogation and addressing possibility via the corresponding connecting lines 10. The addresses and information are transmitted via the connecting lines 10 only in one direction, i.e. opposite the transmission direction of the clocked signal which is delivered at the control output 8 of the control and evaluation unit 2 to the control input 6 of the first monitoring and detection device 1, therefore against the transmission direction of the safety-relevant signals on the signal line. This ensures that the control and evaluation unit 2 notices not only an interruption of the connection between one of the monitoring and detection devices 1, but also ascertains the location of the fault. If for example the signal line between two monitoring and detection devices 1 is interrupted, this is noticed by the control and evaluation unit 2 by no signal arriving at its control input 9 via the signal line; where the fault is located however cannot be ascertained. Because addressing via the connecting lines 10 however takes place in the opposite direction to the transmission direction of the signal line, via successive interrogation of the individual monitoring and detection devices 1 via the connecting line 10 and the switching signal of the addressed monitoring and detection devices 1 which has been acquired via the signal line, it can be ascertained behind which monitoring and detection devices 1 the fault site is located.

If for example in the circuit shown in FIG. 2 the signal line is interrupted between the second and third monitoring and detection device 1, the control and evaluation unit 2 thus begins to interrogate first the fourth monitoring and detection device 1 via the connecting line 10. The control and evaluation unit 2 receives a signal back from the fourth monitoring and detection device 1 via the signal line and thus knows that the connection of the control and evaluation unit 2 to the fourth monitoring and detection device 1 and the fourth monitoring and detection device 1 itself are free of faults. Likewise the control and evaluation unit 2 then acquires a signal back from the third monitoring and detection device 1. But if the second monitoring and detection device 1 is interrogated via the connecting line 10, the control and evaluation unit 2 does not acquire a return message since it is interrupted. In this way fault location by the control and evaluation unit 2 is possible.

In the version of the circuit in FIG. 2 the monitoring and detection devices 1 can only receive addresses and information via the connecting lines 10 when there is an enabling signal on them which can be received via enabling signal inputs 11 on the monitoring and detection devices 1. The enabling signal inputs 11 of all monitoring and detection devices 1 are connected to the enabling signal output 12 of the control and evaluation unit 2.

Figure 3:
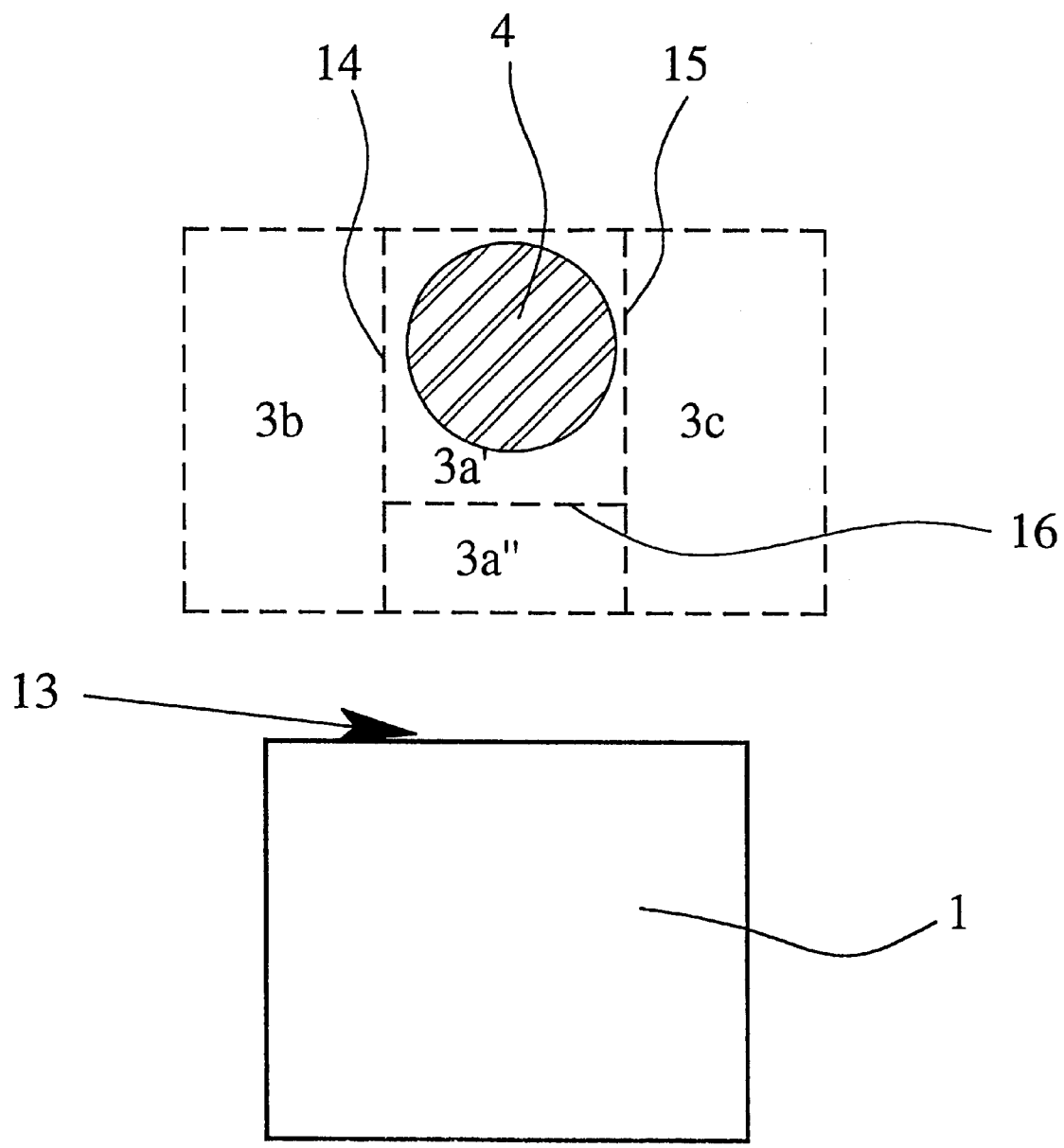
FIG. 3 shows a schematic of the different influence areas of a monitoring and detection device in a circuit as claimed in the invention.

FIG. 3 shows a schematic of the different influence areas of one preferred monitoring and detection device 1 of a circuit as claimed in the invention. The monitoring and detection device 1 is shown from the side so that the breakdown of the different influence areas 3 which are located over the active surface 13 of the monitoring and detection device 1 becomes clear. As in FIG. 1, here the sensitive area of the monitoring and detection device 1 which is made as a proximity switch, which is located above the active surface 13 and which corresponds to the sum of the influence areas 3 is first divided into three influence areas 3a, 3b, and 3c.

The borders 14 between the influence areas 3a–3b on the one hand and the border 15 between the influence areas 3a–3c on the other run perpendicular to the active surface 13 of the monitoring and detection device 1. In addition, the influence area 3a is again divided into two components areas 3a' and 3a", the border 16 between the component area 3a' and the component area 3a" running perpendicular to the borders 14 and 15 and parallel to the active surface 13.

The monitoring and detection devices 1 in a cable railway or chairlift system are generally attached stationary on the supports of the cable railway or chairlift system in the immediate vicinity of the cable pulleys 5 which carry the cable 4. Thus they have a stipulated distance to the cable 4 at the location which they are to monitor. Lateral slippage of the cable 4 relative to the cable pulleys 5 can be ascertained by the influence areas 3a, 3b and 3c of the monitoring and detection devices 1. Dividing the influence areas 3a into two component areas 3a' and 3a" also makes it possible to ascertain the change of the vertical distance of the cable 4 from the active surface 13. One such change can occur for example when the cable pulleys 5 change their position by their loading, i.e. are pressed downward, or when the running surfaces 17 of the cable pulleys 5 are worn.

Of course the borders 14, 15 and 16 which are shown running in a straight line in FIG. 3 for the sake of simplification can also have a bent from so that the influence areas 3a, 3b and 3c and the component areas 3a' and 3a" no longer have rectangular shapes, but can assume almost any shape.

What is claimed is:

1. Circuit for monitoring one or more of the faultless state or for detecting the faulty state of a system, with a plurality of monitoring and detection devices (1) and with at least one control and evaluation unit (2), the monitoring and detection devices (1) being series-connected to one another and to the control and evaluation unit (2) and with the potential to be interrogated with respect to their state, characterized in that each monitoring and detection device (1) has several different influence areas (3) and several signal outputs.

2. Circuit as claimed in claim 1, wherein the monitoring and detection devices (1) are made of electronic proximity switching devices.

3. Circuit as claimed in claim 1, wherein each monitoring and detection device (1) has one control input (6) and one control output (7) and the control output (7) of the (n−1)th monitoring and detection device (1) is connected to the control input (6) of the n-th monitoring and detection device (1).

4. Circuit as claimed in claim 3, wherein the control input (6) of the first monitoring and detection device (1) is connected to the control output (8) of the control and evaluation unit (2) and the control output (7) of the n-th monitoring and detection device (1) is connected to the control input (9) of the control and evaluation unit (2) and thus a signal line is formed from the control output (8) via the n monitoring and detection devices (1) as far as the control input (9) of the control and evaluation unit (2).

5. Circuit as claimed in claim 1, wherein the monitoring and detection devices (1) are addressable and the monitoring and detection devices (1) and the control and evaluation unit (2) form a ring with respect to the interrogation and addressing possibility via corresponding connecting lines (10).

6. Circuit as claimed in claim 5, wherein the addresses and one or more portions of information are transmitted via the connecting lines (10) only in one direction, i.e. opposite the transmission direction of one or more safety-relevant signals on the signal line.

7. Circuit as claimed in claim 1, wherein each monitoring and detection device (1) has at least three different influence areas (3a, 3b, 3c) and at least three signal outputs.

8. Circuit as claimed in claim 1, wherein each monitoring and detection device (1) has at least one influence area (3a) which is in turn divided into two components areas (3a', 3a''), the subdivision into the two component areas (3a', 3a'') running perpendicular to the subdivision into influence areas (3).

9. Circuit according to claim 2, wherein the proximity switching devices are one of inductive and capacitive switching devices.

10. Circuit as claimed in claim 9, wherein each monitoring and detection device (1) has one control input (6) and one control output (7) and the control output (7) of the (n−1)th monitoring and detection device (1) is connected to the control input (6) of the n-th monitoring and detection device (1).

11. Circuit as claimed in claim 4, wherein the monitoring and detection devices (1) are addressable and the monitoring and detection devices (1) and the control and evaluation unit (2) form a ring with respect to the interrogation and addressing possibility via corresponding connecting lines (10).

12. Circuit as claimed in claim 11, wherein the addresses and one or more portions of information are transmitted via the corresponding connecting lines (10) only in one direction, i.e. opposite the transmission direction of one or more safety-relevant signals on the signal line.

13. Circuit as claimed in claim 12, wherein each monitoring and detection device (1) has at least three different influence areas (3a, 3b, 3c) and at least three signal outputs.

14. Circuit as claimed in claim 13, wherein each monitoring and detection device (1) has at least one influence area (3a) which is in turn divided into two components areas (3a', 3a''), the subdivision into the two component areas (3a', 3a'') running perpendicular to the subdivision into influence areas (3).

15. Circuit for monitoring the location of the cable (4) of a cable railway or chairlift system wherein both the lateral slippage of the monitored cable (4) relative to the cable pulleys (5) which guide the cable (4) and also a change of the cable location perpendicular thereto are monitored and detected, with a plurality of monitoring and detection devices (1) and with at least one control and evaluation unit (2), the monitoring and detection devices (1) being series-connected to one another and to the control and evaluation unit (2) and with the potential to be interrogated with respect to their state characterized in that each monitoring and detection device (1) has several different influence areas (3) and several signal outputs, wherein each monitoring and detection device (1) has at least one influence area (3a) which is in turn divided into two components areas (3a', 3a''), the subdivision into the two component areas (3a',3a'') running perpendicular to the subdivision into influence areas (3).

* * * * *